US008916782B2

(12) United States Patent
Wu et al.

(10) Patent No.: US 8,916,782 B2
(45) Date of Patent: Dec. 23, 2014

(54) MULTI-LAYERED CIRCUIT BOARD AND ELECTRO-STATIC DISCHARGE PROTECTION STRUCTURE

(75) Inventors: Hsin-Ting Wu, Taoyuan County (TW); Kai-Yuan Siao, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 324 days.

(21) Appl. No.: 13/526,528

(22) Filed: Jun. 19, 2012

(65) Prior Publication Data

US 2013/0140072 A1 Jun. 6, 2013

(30) Foreign Application Priority Data

Dec. 5, 2011 (TW) .............................. 100144642 A

(51) Int. Cl.
*H05K 1/11* (2006.01)
*H02H 9/04* (2006.01)

(52) U.S. Cl.
USPC .............. 174/262; 174/257; 174/261; 361/56

(58) Field of Classification Search
USPC ............................ 174/257, 261, 262; 361/56
See application file for complete search history.

(56) References Cited

U.S. PATENT DOCUMENTS 5,280,646 A *  1/1994  Koyama et al. ............... 455/300
6,493,198 B1   12/2002  Arledge et al.
7,817,395 B2 * 10/2010  Durth ............................ 361/112
7,869,180 B2 *  1/2011  Cheung et al. ................ 361/128
7,894,172 B2    2/2011  Pan et al.
8,294,035 B2 * 10/2012  Chou et al. ..................... 174/257
8,395,875 B2 *  3/2013  Tresness ........................ 361/117
2002/0001160 A1 *  1/2002  Berberich ...................... 361/112
2014/0168834 A1 *  6/2014  Kanemaru ....................... 361/56
2014/0177114 A1 *  6/2014  Otsubo, Yoshihito .......... 361/56

FOREIGN PATENT DOCUMENTS

CN        1310578      8/2001
TW         589930      6/2004

* cited by examiner

*Primary Examiner* — Jeremy C Norris
*Assistant Examiner* — Nathan Milakovich
(74) *Attorney, Agent, or Firm* — Jianq Chyun IP Office

(57) ABSTRACT

An electro-static discharge (ESD) protection structure includes a first insulation layer (having a first surface, a second surface opposite to the first surface, and a through hole), a patterned conductive layer (located on the first surface), an electro-static releasing layer (located on the second surface), and a solder mask layer. At least one portion of the patterned conductive layer surrounds the through hole. The electro-static releasing layer is electrically insulated from the patterned conductive layer. At least one portion of the electro-static releasing layer is around the through hole. The solder mask layer covers the first insulation layer and a portion of the patterned conductive layer and exposes a portion of the patterned conductive layer surrounding the through hole. A multi-layered circuit board including a second insulation layer, a power supply layer, a third insulation layer and the ESD protection structure is also provided.

20 Claims, 4 Drawing Sheets

MULTI-LAYERED CIRCUIT BOARD AND ELECTRO-STATIC DISCHARGE PROTECTION STRUCTURE

CROSS-REFERENCE TO RELATED APPLICATION

This application claims the priority benefit of Taiwan application Ser. No. 100144642, filed on Dec. 5, 2011. The entirety of the above-mentioned patent application is hereby incorporated by reference herein and made a part of this specification.

BACKGROUND OF THE INVENTION

1. Field of the Invention

The invention relates to a multi-layered circuit board. More particularly, the invention relates to a multi-layered circuit board with an electro-static discharge (ESD) protection structure.

2. Description of Related Art

During or after fabrication of an integrated circuit (IC), the IC is often damaged due to electrostatic discharge (ESD). For instance, the ESD frequently harms an electronic device (e.g., a chip) assembled onto a printed circuit board (PCB). Hence, the IC itself is required to have an ESD protection function, so as to prevent the external electro-static current from impairing the IC. In addition, during production and assembly of a PCB, the PCB is frequently in contact with hands of workers, other PCBs, assembly machine or testing tools. Hence, the ESD is likely to cause damages to the PCB itself or the IC on the PCB.

In most cases, the ESD protection of the electronic device refers to prevention of accumulation of electro-static charges, so as to avoid instant discharge resulting from the accumulated electro-static charges. To preclude the accumulation of electro-static charges, the electro-static charges are often released through point discharge (or marginal discharges). When the electro-static charges are accumulated in a conductor, the charges are distributed on an outer surface of the conductor because the net electric field within the conductor is zero. The outer surface of the charged conductor in electrostatic equilibrium is an equipotential surface. Besides, the larger the surface radius of curvature of an object, the higher the density of charges; the smaller the surface radius of curvature of an object, the lower the density of charges. When the surface radius of curvature of an object is large (e.g., at a tip), the electric field increases drastically such that air around the object is ionized and converted into positive and negative ions. Discharge then occurs at the tip which attracts and neutralizes counter ions, which is the so-called point discharge (or marginal discharges).

Another way to take precautions to avoid the ESD from impairing an electronic device refers to improvement of ESD protection capability of the electronic device itself (e.g., IC). For instance, resistors connected in series or in parallel may be formed on the circuit to restrain the amount of ESD current that flows through the IC, so as to effectively prevent the ESD from impairing the electronic device. In case that the ESD is devastating, it is likely to use transient voltage suppressors (TVS) or Zener diodes connected in parallel for current restraint. However, the use of TVS or Zener diode not only complicates the circuit design but also increases the manufacturing costs. Moreover, the use of TVS or Zener diode is against the trend of miniaturizing the dimensions of circuit boards.

SUMMARY OF THE INVENTION

In view of the above, a multi-layered circuit board is provided in the invention, so as to mitigate ESD damages to an electronic device.

In the invention, a multi-layered circuit board including a first insulation layer, a patterned conductive layer, an electrostatic releasing layer, a second insulation layer, a power supply layer, and a third insulation layer is provided. The first insulation layer has a first surface, a second surface opposite to the first surface, and at least one through hole. The patterned conductive layer is located on the first surface, and at least one portion of the patterned conductive layer surrounds the through hole. The electro-static releasing layer is located on the second surface and electrically insulated from the patterned conductive layer. At least one portion of the electrostatic releasing layer is located around the through hole. The second insulation layer is located below the first insulation layer, such that the electro-static releasing layer is sandwiched between the first insulation layer and the second insulation layer. The power supply layer and the electro-static releasing layer are located at two opposite sides of the second insulation layer, respectively. The third insulation layer is located below the second insulation layer, such that the power supply layer is sandwiched between the second insulation layer and the third insulation layer. Here, the through hole is formed in the second insulation layer, the power supply layer, and the third insulation layer, and there is no conductive material within the through hole.

According to an embodiment of the invention, the patterned conductive layer includes a conductive wire and the through hole is located within a layout range of the conductive wire.

According to an embodiment of the invention, the patterned conductive layer includes a conductive wire and the through hole is located outside a layout range of the conductive wire.

According to an embodiment of the invention, the multi-layered circuit board further includes a solder mask layer covering the patterned conductive layer. The solder mask layer has at least one first notch adjacent to the through hole and exposes a portion of the patterned conductive layer surrounding the through hole.

According to an embodiment of the invention, a shape of the exposed portion of the patterned conductive layer is a semi-ring shape, for instance.

According to an embodiment of the invention, an end of the semi-ring-shaped exposed portion of the patterned conductive layer has at least one ESD structure.

According to an embodiment of the invention, the electrostatic releasing layer has a second notch exposing the second surface, and the second notch is located around the through hole. Here, the second notch is in a semi-ring shape, such that a portion of the electro-static releasing layer located around the through hole has at least one ESD structure.

According to an embodiment of the invention, the first notch of the solder mask layer is located above the second notch of the electro-static releasing layer.

According to an embodiment of the invention, the ESD structure is located adjacent to the through hole.

According to an embodiment of the invention, a shape of the exposed portion of the patterned conductive layer includes a fan-out shape, and an end of the fan-out exposed portion of the patterned conductive layer has at least one ESD structure.

According to an embodiment of the invention, the at least one portion of the patterned conductive layer surrounding the through hole substantially has a ring-shaped structure or a semi-ring-shaped structure.

According to an embodiment of the invention, there is a certain distance between the power line and the through hole.

In the invention, an ESD protection structure including a first insulation layer, a patterned conductive layer, an electro-static releasing layer, and solder mask layer is provided. The first insulation layer has a first surface, a second surface opposite the first surface, and a through hole, wherein there is no conductive material within the through hole. The patterned conductive layer is located on the first surface, and at least one portion of the patterned conductive layer surrounds the through hole. The electro-static releasing layer is located on the second surface and electrically insulated from the patterned conductive layer. At least one portion of the electro-static releasing layer is located around the through hole. The solder mask layer covers the first insulation layer and a portion of the patterned conductive layer and exposes a portion of the patterned conductive layer surrounding the through hole.

According to an embodiment of the invention, a shape of the exposed portion of the patterned conductive layer is a semi-ring shape, for instance.

According to an embodiment of the invention, an end of the semi-ring-shaped exposed portion of the patterned conductive layer has at least one ESD structure.

According to an embodiment of the invention, the electro-static releasing layer has a second notch exposing the second surface, and the second notch is located around the through hole. Here, the second notch is in a semi-ring shape, such that a portion of the electro-static releasing layer located around the through hole has at least one discharge structure.

According to an embodiment of the invention, the semi-ring-shaped exposed portion of the patterned conductive layer is located right above the semi-ring-shaped notch.

According to an embodiment of the invention, the discharge structure is located around the through hole.

According to an embodiment of the invention, a shape of the exposed portion of the patterned conductive layer includes a fan-out shape, and an end of the fan-out exposed portion of the patterned conductive layer has at least one ESD structure.

According to an embodiment of the invention, the at least one portion of the patterned conductive layer surrounding the through hole substantially has a ring-shaped structure.

According to an embodiment of the invention, the at least one portion of the patterned conductive layer surrounding the through hole substantially has a semi-ring-shaped structure.

In the invention, it is not necessary to expand the circuit layout area of the PCB, and the fabrication of the multi-layered circuit board and the fabrication of the ESD protection structure are compatible with the fabrication of the existing PCB without increasing the manufacturing costs. Moreover, the required number of the ESD protection structures can be formed on any location of the PCB in the invention, and thus electronic devices on the PCB can achieve favorable ESD protection effects.

To make the above and other features and advantages of the application, more comprehensible, several embodiments accompanied with figures are detailed as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DESCRIPTION OF EMBODIMENTS

Figure 1:
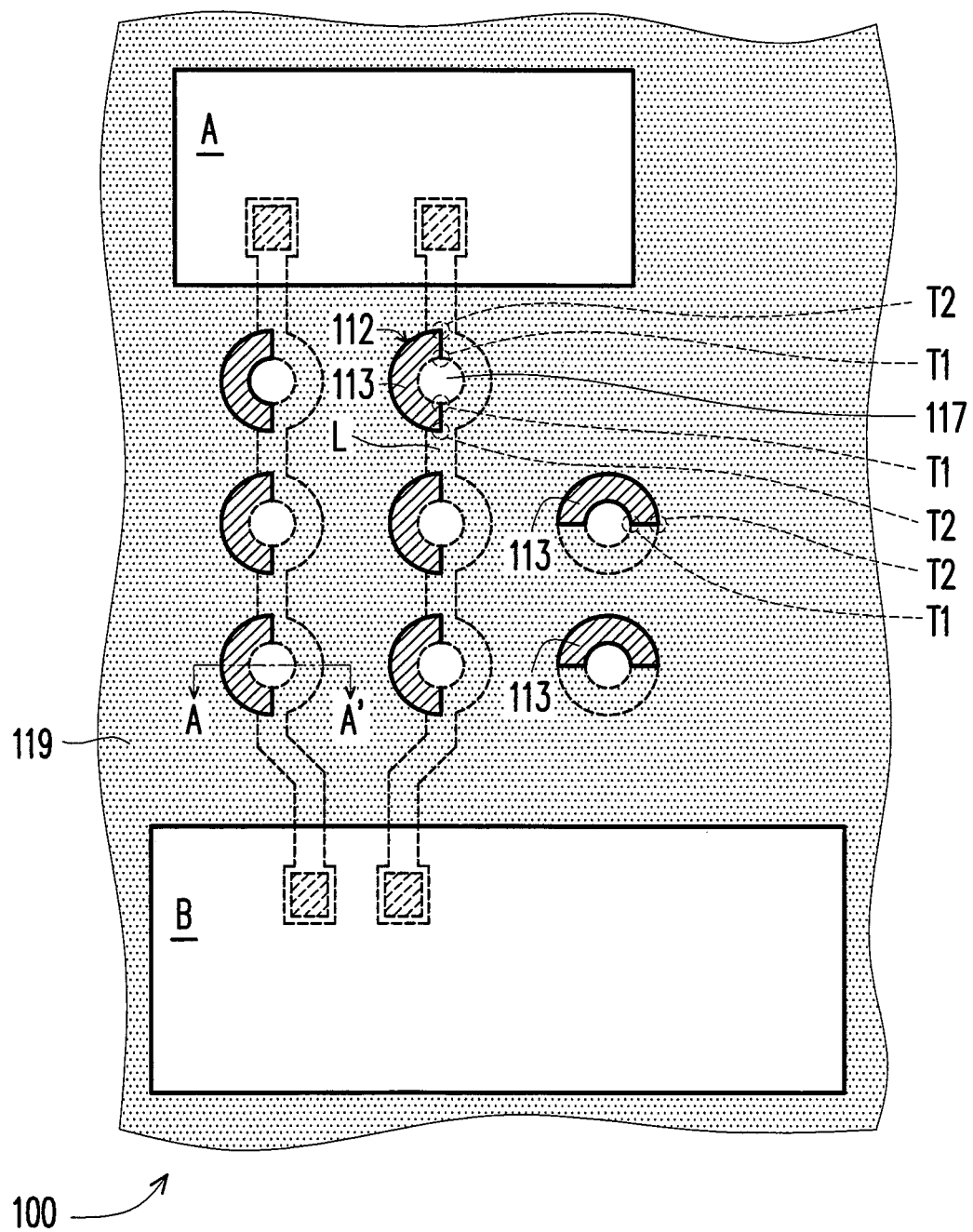
FIG. 1 is a schematic top view illustrating a multi-layered circuit board according to an embodiment of the invention.
Figure 2A:
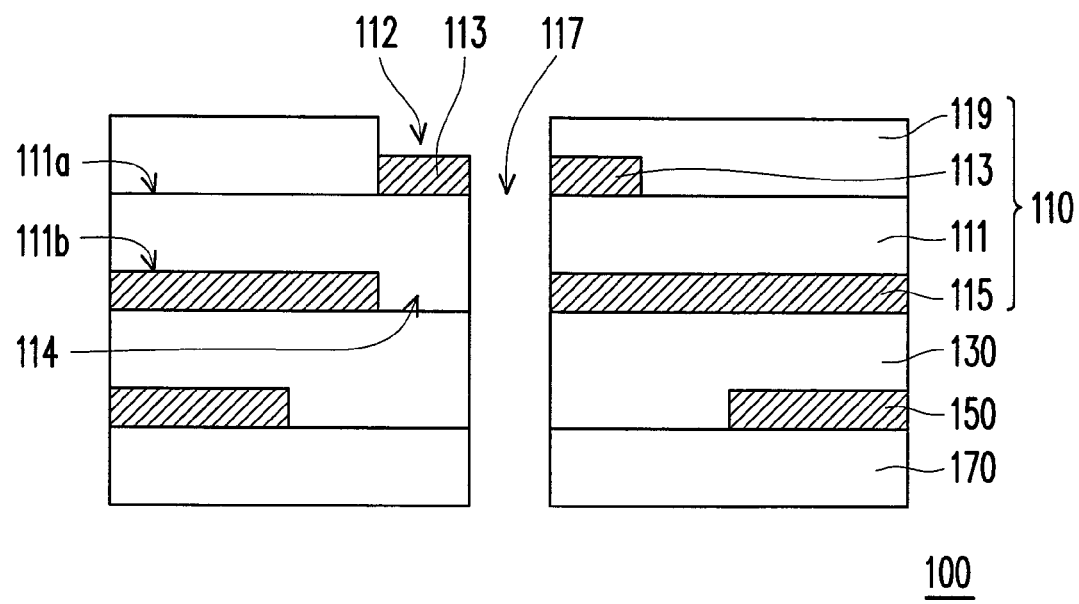
FIG. 2A is a schematic cross-sectional view taken along a cross-section A-A' depicted in FIG. 1.

FIG. 1 is a schematic top view illustrating a multi-layered circuit board according to an embodiment of the invention. FIG. 2A is a schematic cross-sectional view taken along a cross-section A-A' depicted in FIG. 1. With reference to FIG. 1 and FIG. 2A, a multi-layered circuit board 100 described in the embodiment has an ESD protection structure 110. Specifically, the ESD protection structure 110 is integrated with traces or wires in the multi-layered circuit board 100, so as to improve reliability of the multi-layered circuit board 100.

According to the present embodiment, the ESD protection structure 110 includes a first insulation layer 111, a patterned conductive layer 113, and an electro-static releasing layer 115. When the ESD protection structure 110 is integrated within the multi-layered circuit board 100, a core layer, a laminated dielectric layer, or a built-up dielectric layer in the multi-layered circuit board 100 may serve as the first insulation layer 111 of the ESD protection structure 110. In addition, conductive patterns (e.g., a signal layer and a ground layer) in the multi-layered circuit board 100 may serve as the patterned conductive layer 113 and the electro-static releasing layer 115 of the ESD protection structure 110. For instance, the signal layer in the multi-layered circuit board 100 may serve as the patterned conductive layer 113 of the ESD protection structure 110, and the ground layer in the multi-layered circuit board 100 may act as the electro-static releasing layer 115 of the ESD protection structure 110.

In the present embodiment, the first insulation layer 111 is, for instance, made of a dielectric material, such as glass fiber, silicon oxide, silicon nitride, and so on; the patterned conductive layer 113 and the electro-static releasing layer 115 are, for instance, made of copper or any other conductive material.

In the ESD protection structure 110 described in the present embodiment, the first insulation layer 111 has a first surface 111a, a second surface 111b, and a through hole 117, and the patterned conductive layer 113 is located on the first surface 111a. Here, at least one portion of the patterned conductive layer 113 surrounds the through hole 117. The electro-static releasing layer 115 is located on the second surface 111b and electrically insulated from the patterned conductive layer 113. At least one portion of the electro-static releasing layer 115 is located around the through hole 117.

It is clearly shown in FIG. 2A that the through hole 117 described in the present embodiment is formed in the multi-layered circuit board 100, and there is no conductive material distributed within the through hole 117 of the first insulation layer 111, i.e., the through hole 117 is different from the conductive via of a normal PCB for communicating patterned circuits in different layers. However, the side wall of the first insulation layer 111 adjacent to the through hole 117 may or may not have a conductive material, and the invention is not limited thereto. Namely, in other feasible embodiments, the side wall of the first insulation layer 111 adjacent to the through hole 117 may selectively have a conductive material thereon as long as the conductive material is electrically insulated from the patterned conductive layer 113 and the electro-static releasing layer 115.

With reference to FIG. 2A, the multi-layered circuit board 100 of the present embodiment may further include a solder mask layer 119 that covers the first insulation layer 111 and a portion of the patterned conductive layer 113. To be more specific, the solder mask layer 119 has a first notch 112 located beside the through hole 117 and exposing a portion of the patterned conductive layer 113. For instance, a portion of the patterned conductive layer 113 surrounding the through hole 117 is substantially a ring-shaped pattern, and the first notch 112 is a semi-ring-shaped pattern and exposes the semi-ring-shaped patterned conductive layer 113. The semi-ring-shaped exposed portion of the patterned conductive layer 113 has at least one end T1 pointing at the through hole 117. Here, the end T1 forms a point ESD structure.

According to the present embodiment, the multi-layered circuit board 100 may further include a second insulation layer 130, a power supply layer 150, and a third insulation layer 170. The second insulation layer 130 is located below the first insulation layer 111, such that the electro-static releasing layer 115 is sandwiched between the first insulation layer 111 and the second insulation layer 130. The power supply layer 150 is located below the second insulation layer 130, and the power supply layer 150 and the electro-static releasing layer 115 are located at upper and lower sides of the second insulation layer 130, respectively. The third insulation layer 170 is located below the second insulation layer 130, such that the power supply layer 150 is sandwiched between the second insulation layer 130 and the third insulation layer 170. However, it should be mentioned that the cross-section of the multi-layered circuit board 100 is not limited to that depicted in FIG. 2A in the present embodiment, i.e., the ESD protection structure 110 may also be integrated into other types of multi-layered circuit boards according to the present embodiment.

As shown in FIG. 2A, there is a certain distance between the power supply layer 150 and the through hole 117, so as to prevent the end T1 from triggering an ESD event on the power supply layer 150 and further avoid unstable voltages and damages to devices. However, whether there is a certain distance between the power supply layer 150 and the through hole 117 is not limited in the invention. When the difference in height between the end T1 and the power supply layer 150 is sufficient, the end T1 is much less likely to trigger an ESD event on the power supply layer 150, and the power supply layer 150 may still be extended to be in contact with the through hole 117.

Figure 2B:
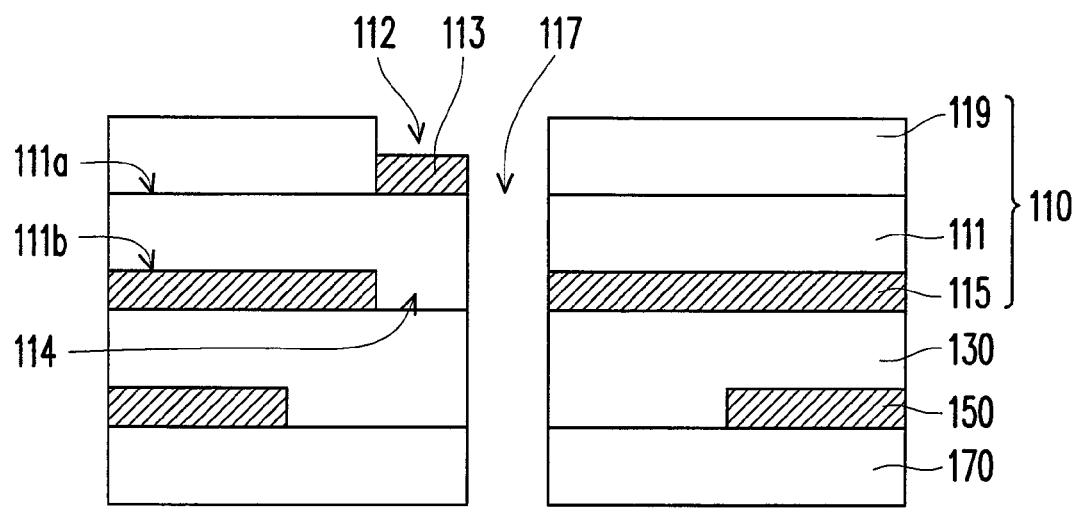
FIG. 2B is a schematic cross-sectional view taken along the cross-section A-A' depicted in FIG. 1 according to another embodiment of the invention.

FIG. 2B is a schematic cross-sectional view taken along the cross-section A-A' depicted in FIG. 1 according to another embodiment of the invention. With reference to FIG. 1 and FIG. 2B, in the present embodiment, the end T1 need not be defined by the first notch 112 of the solder mask layer 119; instead, the patterned conductive layer 113 itself is equipped with the end T1. Note that the end T1 is still required to be exposed. Specifically, the patterned conductive layer 113 of the present embodiment does not entirely surround the through hole 117, for instance, and the patterned conductive layer 113 is in a semi-ring shape (similar to the shape of the first notch 112 depicted in FIG. 1), for instance.

In the multi-layered circuit board 100 of the present embodiment, the patterned conductive layer 113 includes one or more conductive wires L, and the through holes 117 and the ends T1 are located within a layout range of the conductive wire(s) L. Apparently, the end T1 helps resolve the issue of electro-static accumulation on the conductive wire(s) L and allow the electro-static charges to be guided to the electro-static releasing layer 115 in an effective and efficient manner, thus reducing the possibility of ESD damages to the multi-layered circuit board 100.

It can be learned from FIG. 1 that the conductive wire(s) L is/are electrically connected between electronic devices A and B, and one or more through holes 117 and one or more ESD protection structures 110 may be formed on each conductive wire L based on actual layout area, so as to optimize the electro-static releasing effects.

According to another embodiment, the through hole 117 (e.g., the two through holes at the right-hand side in FIG. 1) may also be located outside the layout range of the conductive wire(s) L. Electro-static accumulation does not necessarily occur on the conductive wire(s) L and may occur at any location of the multi-layered circuit board 100. Hence, the design of configuring the through hole 117 and the ESD protection structure 110 outside the layout range of the conductive wire(s) L can also reduce the possibility of the ESD damages to the multi-layered circuit board 100.

The correlation between the patterned conductive layer 113 and the electro-static releasing layer 115 is elaborated hereinafter with reference to FIG. 3A to FIG. 3D.

Figure 3A:
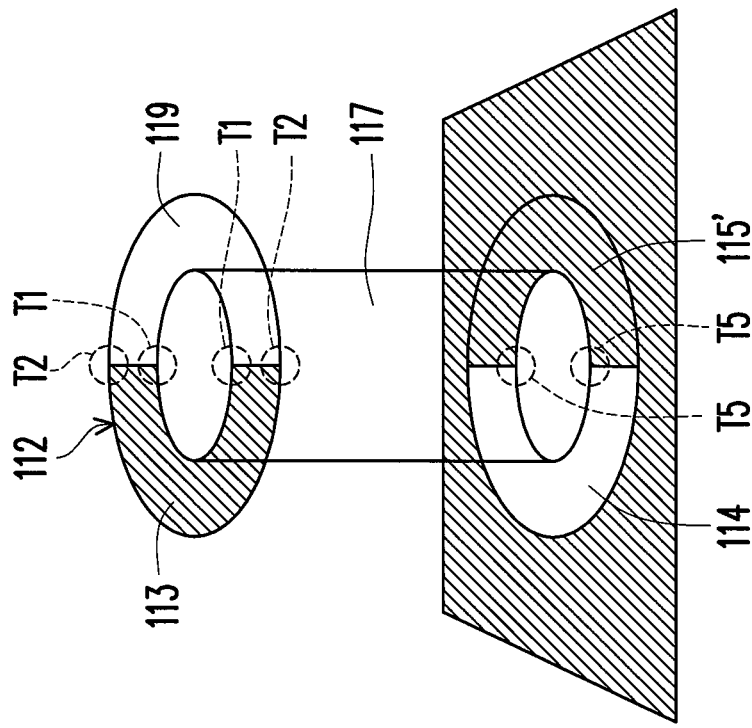
FIG. 3A is a schematic view illustrating a portion of the patterned conductive layer and a portion of the electro-static releasing layer of the present embodiment.

FIG. 3A is a schematic view illustrating the patterned conductive layer and the electro-static releasing layer of the present embodiment. With reference to FIG. 2A and FIG. 3A, the exposed patterned conductive layer 113 of the present embodiment has at least one end T1 pointing at the through hole 117, and the electro-static releasing layer 115 surrounds the through hole 117, such that static charges accumulated on the patterned conductive layer 113 are apt to be transmitted to the electro-static releasing layer 115 through the end T1 by way of point discharge (or marginal discharges). As indicated in FIG. 3A, the patterned conductive layer 113 is a ring-shaped pattern, for instance. A portion of the patterned conductive layer 113 is covered by the solder mask layer 119, and the solder mask layer 119 covering the patterned conductive layer 113 has a first notch 112 to expose a portion of the patterned conductive layer 113. For instance, the first notch 112 of the solder mask layer 119 is a semi-ring-shaped notch for defining two ends T1 and two ends T2 on the patterned conductive layer 113. The shortest distance between each end T1 and the through hole 117 may be zero or nearly zero, and the shortest distance between each end T2 and the through hole 117 is 4 mils, for instance. A diameter of the through hole 117 is 10 mils, for instance.

In addition, when the electro-static releasing layer 115 is integrated into the ground layer of the multi-layered circuit board, the electro-static releasing layer 115 entirely covers second surface 111b of the first insulation layer 111 and at least one portion of the electro-static releasing layer 115 surrounds the through hole 117.

Note that the ends T2 not only help the static charges enter the patterned conductive layer 113 but also allow the charges to be released from the ends T1 to the electro-static releasing layer 115, so as to guarantee favorable ESD protection to a better extent.

Figure 3B:
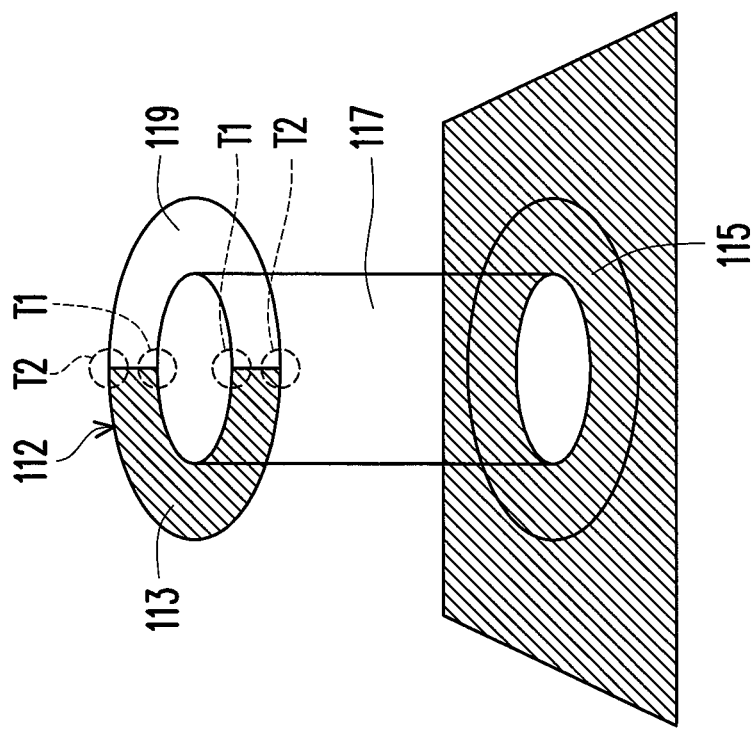
FIG. 3B is a schematic view illustrating a portion of a patterned conductive layer and a portion of an electro-static releasing layer according to another embodiment of the invention.

FIG. 3B is a schematic view illustrating the patterned conductive layer and the electro-static releasing layer according to another embodiment. With reference to FIG. 3B, the electro-static releasing layer 115' of the present embodiment is different from the electro-static releasing layer 115 depicted in FIG. 3A. Specifically, only a portion of the electro-static releasing layer 115' of the present embodiment surrounds the through hole 117, the electro-static releasing layer 115' has ends T5 pointing at the through hole 117, and the ends T5 are located right below the ends T1, for instance. The accumulated static charges on the patterned conductive layer 113 are more likely to be transmitted to the electro-static releasing layer 115' through the ends T1 to the ends T5 by way of point discharge (or marginal discharges).

Moreover, when the electro-static releasing layer 115' is integrated into the ground layer of the multi-layered circuit board, the electro-static releasing layer 115' has the second notch 114 communicating the through hole 117. Here, the electro-static releasing layer 115' entirely covers the second surface 111b of the first insulation layer 111 except the location of the second notch 114 and the through hole 117. The second notch 114 defines the ends T5, and the ends T5 allow the electro-static releasing layer 115' to easily receive the static charges released from the ends T1. In other feasible embodiments, the second notch 114 may be selectively filled with the first insulation layer 111. That is to say, the first insulation layer 111 may be in contact with the second insulating layer 130.

For instance, the first notch 112 is located right above the second notch 114, and the first notch 112 and the second notch 114 have substantially the same shape and the same measure of area. Particularly, the ends T1 are located right above the ends T5, and most static charges released from the ends T1 are transmitted to the electro-static releasing layer 115' through the ends T5. Accordingly, the ESD protection structure described in the present embodiment can achieve favorable ESD protection effects.

In the invention, the number and the locations of the ends T1 and T2 may be changed by modifying the shape of the first notch 112 of the solder mask layer 119, and the number and the locations of the ends T5 may be changed by modifying the shape of the second notch 114. People having ordinary skill in the art may, without departing from the scope of the invention, change the number and the locations of the ends T1, T2, and T5 based on the above-mentioned principles. Further descriptions are provided below with reference to FIG. 3C and FIG. 3D.

Figure 3D:
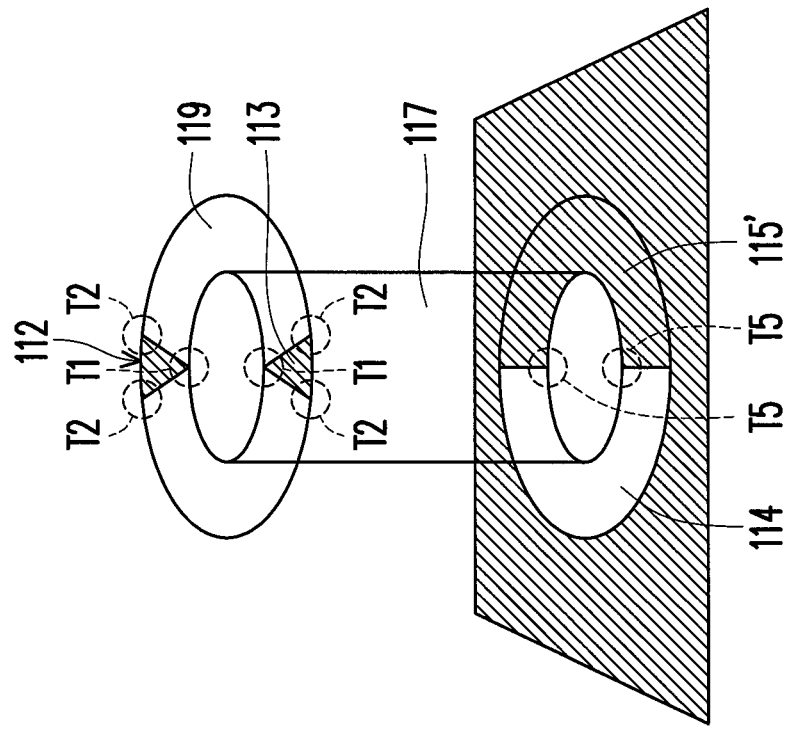
FIG. 3C and FIG. 3D are schematic views illustrating a patterned conductive layer in other feasible embodiments of the invention.
Figure 3C:
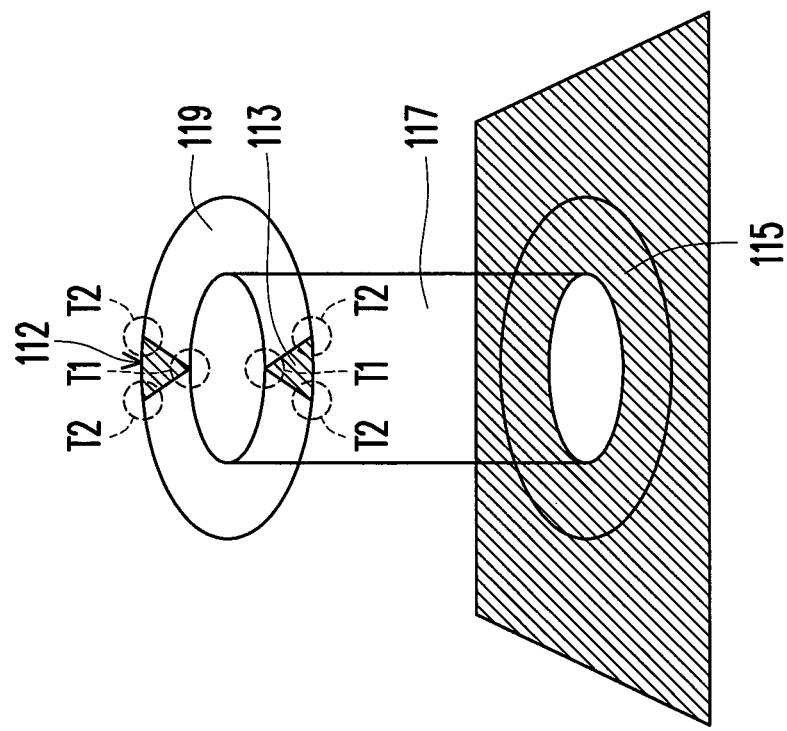

FIG. 3C and FIG. 3D are schematic views illustrating a patterned conductive layer in other feasible embodiments of the invention. With reference to FIG. 3C and FIG. 3D, the first notch 112 of the solder mask layer 119 may be designed to be in a fan-out shape, and the fan-out first notch 112 may define one end T1 and two ends T2 of the patterned conductive layer 113. In FIG. 3C, the electro-static releasing layer 115 is a ring-shaped pattern; and in FIG. 3D, the electro-static releasing layer 115' is a semi-ring-shaped pattern.

In view of the above, the ESD protection structure of the invention does not require additional devices and can be configured on the circuit board having the restrained measure of area (the ESD protection structure may even be configured directly on the conductive wire(s)) in comparison with the conventional ESD protection structure. Thereby, the ESD protection structure described herein has the simple circuit layout without increasing the manufacturing costs and can still accomplish favorable ESD protection effects.

Although the invention has been disclosed by the above embodiments, these embodiments are not intended to limit the invention. Those skilled in the art may make some modifications and alterations without departing from the spirit and scope of the invention. Therefore, the protection range of the invention falls in the appended claims.

What is claimed is:

1. A multi-layered circuit board comprising:
   a first insulation layer having a first surface, a second surface opposite to the first surface, and at least one through hole;
   a patterned conductive layer located on the first surface, at least one portion of the patterned conductive layer surrounding the through hole;
   an electro-static releasing layer located on the second surface and electrically insulated from the patterned conductive layer, at least one portion of the electro-static releasing layer being located around the through hole;
   a second insulation layer located below the first insulation layer, such that the electro-static releasing layer is sandwiched between the first insulation layer and the second insulation layer;
   a power supply layer located below the second insulation layer, the power supply layer and the electro-static releasing layer being respectively located at two opposite sides of the second insulation layer; and
   a third insulation layer located below the second insulation layer, such that the power supply layer is sandwiched between the second insulation layer and the third insulation layer, wherein the through hole is formed in the second insulation layer, the power supply layer, and the third insulation layer, and there is no conductive material within the through hole.

2. The multi-layered circuit board as recited in claim 1, wherein the patterned conductive layer comprises a conductive wire and the through hole is located within a layout range of the conductive wire.

3. The multi-layered circuit board as recited in claim 1, wherein the patterned conductive layer comprises a conductive wire and the through hole is located outside a layout range of the conductive wire.

4. The multi-layered circuit board as recited in claim 1, further comprising a solder mask layer covering the patterned conductive layer, the solder mask layer having at least one first notch adjacent to the through hole and exposing a portion of the patterned conductive layer surrounding the through hole.

5. The multi-layered circuit board as recited in claim 4, wherein a shape of the exposed portion of the patterned conductive layer comprises a semi-ring shape.

6. The multi-layered circuit board as recited in claim 5, wherein an end of the semi-ring-shaped exposed portion of the patterned conductive layer has at least one electro-static discharge structure.

7. The multi-layered circuit board as recited in claim 4, wherein the electro-static releasing layer has a second notch, and the second notch is located around the through hole and is in a semi-ring shape, such that the portion of the electro-static releasing layer located around the through hole has at least one electro-static discharge structure.

8. The multi-layered circuit board as recited in claim 7, wherein the at least one first notch of the solder mask layer is located above the second notch of the electro-static releasing layer.

9. The multi-layered circuit board as recited in claim 6, wherein the electro-static discharge structure is located adjacent to the through hole.

10. The multi-layered circuit board as recited in claim 4, wherein a shape of the exposed portion of the patterned conductive layer comprises a fan-out shape, and an end of the fan-out exposed portion of the patterned conductive layer has at least one electro-static discharge structure.

11. The multi-layered circuit board as recited in claim 1, wherein the at least one portion of the patterned conductive layer surrounding the through hole substantially has a ring-shaped structure or a semi-ring-shaped structure.

12. The multi-layered circuit board as recited in claim 1, wherein there is a certain distance between the power supply layer and the through hole.

13. An electro-static discharge protection structure comprising:
- a first insulation layer having a first surface, a second surface opposite to the first surface, and a through hole, wherein there is no conductive material within the through hole;
- a patterned conductive layer located on the first surface, at least one portion of the patterned conductive layer surrounding the through hole;
- an electro-static releasing layer located on the second surface and electrically insulated from the patterned conductive layer, the through hole is formed in a portion of the electro-static releasing layer, as that at least one portion of the electro-static releasing layer being located around the through hole; and
- a solder mask layer covering the first insulation layer and a portion of the patterned conductive layer and exposing a portion of the patterned conductive layer surrounding the through hole.

14. The electro-static discharge protection structure as recited in claim 13, wherein a shape of the exposed portion of the patterned conductive layer comprises a semi-ring shape.

15. The electro-static discharge protection structure as recited in claim 14, wherein an end of the semi-ring-shaped exposed portion of the patterned conductive layer has at least one discharge structure.

16. The electro-static discharge protection structure as recited in claim 14, wherein the electro-static releasing layer has a notch located around the through hole and is in a semi-ring shape, such that the portion of the electro-static releasing layer located around the through hole has at least one discharge structure.

17. The electro-static discharge protection structure as recited in claim 16, wherein the semi-ring-shaped exposed portion of the patterned conductive layer is located right above the semi-ring-shaped notch.

18. The electro-static discharge protection structure as recited in claim 15, wherein the discharge structure is located around the through hole.

19. The electro-static discharge protection structure as recited in claim 13, wherein a shape of the exposed portion of the patterned conductive layer comprises a fan-out shape, and an end of the fan-out exposed portion of the patterned conductive layer has at least one electro-static discharge structure.

20. The electro-static discharge protection structure as recited in claim 13, wherein the patterned conductive layer is substantially a ring-shaped structure or a semi-ring-shaped structure.

* * * * *